(12) United States Patent
Nishimura

(10) Patent No.: US 8,125,789 B2
(45) Date of Patent: Feb. 28, 2012

(54) WIRING SUBSTRATE AND ELECTRONIC DEVICE

(75) Inventor: Takao Nishimura, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 727 days.

(21) Appl. No.: 12/046,893

(22) Filed: Mar. 12, 2008

(65) Prior Publication Data
US 2008/0223608 A1 Sep. 18, 2008

(30) Foreign Application Priority Data
Mar. 12, 2007 (JP) .................... 2007-061531

(51) Int. Cl.
*H05K 7/10* (2006.01)
(52) U.S. Cl. ......... 361/767; 361/768; 361/777; 174/557
(58) Field of Classification Search .................. 174/260, 174/261, 263, 520, 526, 534, 535, 549, 557, 174/255; 361/760, 767, 768, 777, 783, 808; 257/737, 777, 778, 780, 786, E23.021, E23.023
See application file for complete search history.

(56) References Cited

U.S. PATENT DOCUMENTS

| | | | |
|---|---|---|---|
| 5,160,409 A | 11/1992 | Moore et al. | |
| 5,444,303 A * | 8/1995 | Greenwood et al. | 257/786 |
| 6,307,159 B1 * | 10/2001 | Soejima et al. | 174/250 |
| 2002/0053463 A1* | 5/2002 | Slocum | 174/250 |
| 2002/0093803 A1* | 7/2002 | Olzak et al. | 361/767 |
| 2005/0012221 A1* | 1/2005 | Kirby et al. | 257/773 |
| 2005/0139387 A1* | 6/2005 | Nishi et al. | 174/260 |

FOREIGN PATENT DOCUMENTS

| | | |
|---|---|---|
| JP | 5-30818 A | 11/1993 |
| JP | 6-216507 A | 8/1994 |
| JP | 06-511353 A | 12/1994 |
| JP | 2000-77471 A | 3/2000 |
| JP | 2004-40056 A | 2/2004 |
| JP | 3115062 U | 11/2005 |

* cited by examiner

*Primary Examiner* — Hoa C Nguyen
(74) *Attorney, Agent, or Firm* — Westerman, Hattori, Daniels & Adrian, LLP

(57) ABSTRACT

A wiring substrate includes a plurality of electrode terminals, to which external connection terminals of an electronic component are coupled, arranged in a row on one principal surface thereof, wherein the electrode terminals each include: a first linear portion; a second linear portion extending from an end of the first linear portion in a direction different from a direction of the first linear portion; and a bent portion that is a part where the first linear portion and the second linear portion are connected.

15 Claims, 16 Drawing Sheets

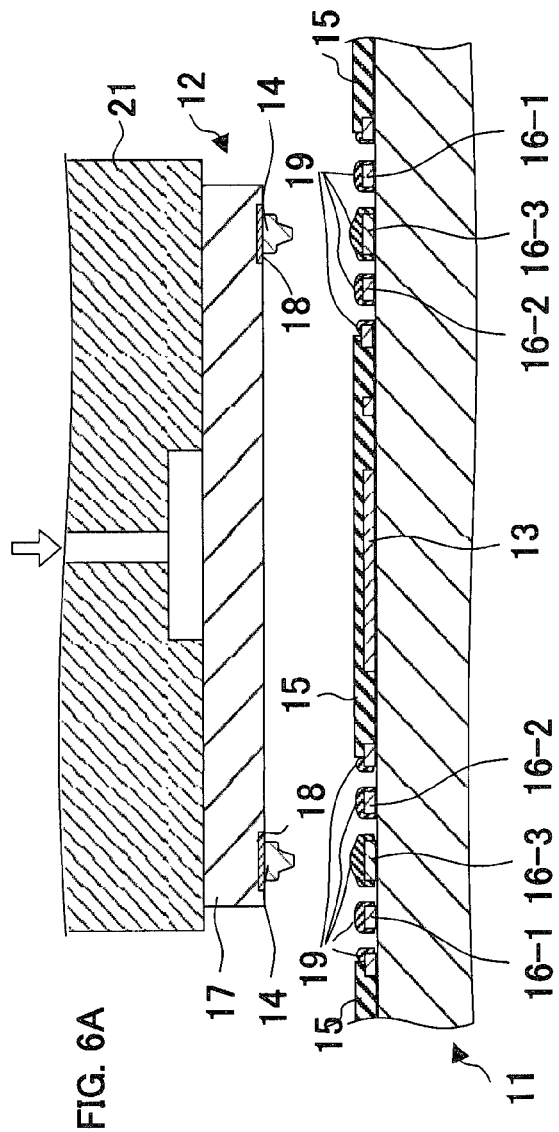
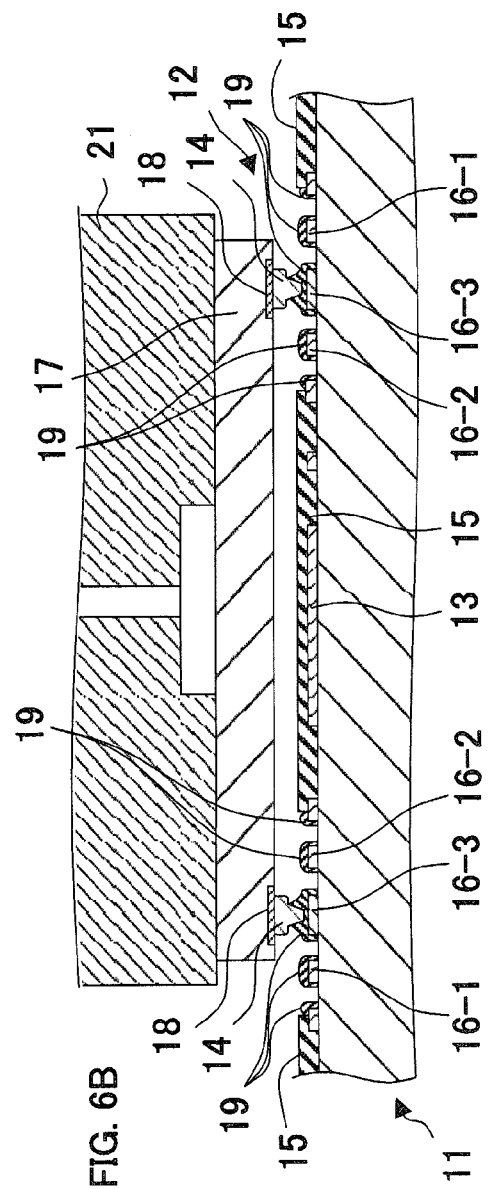

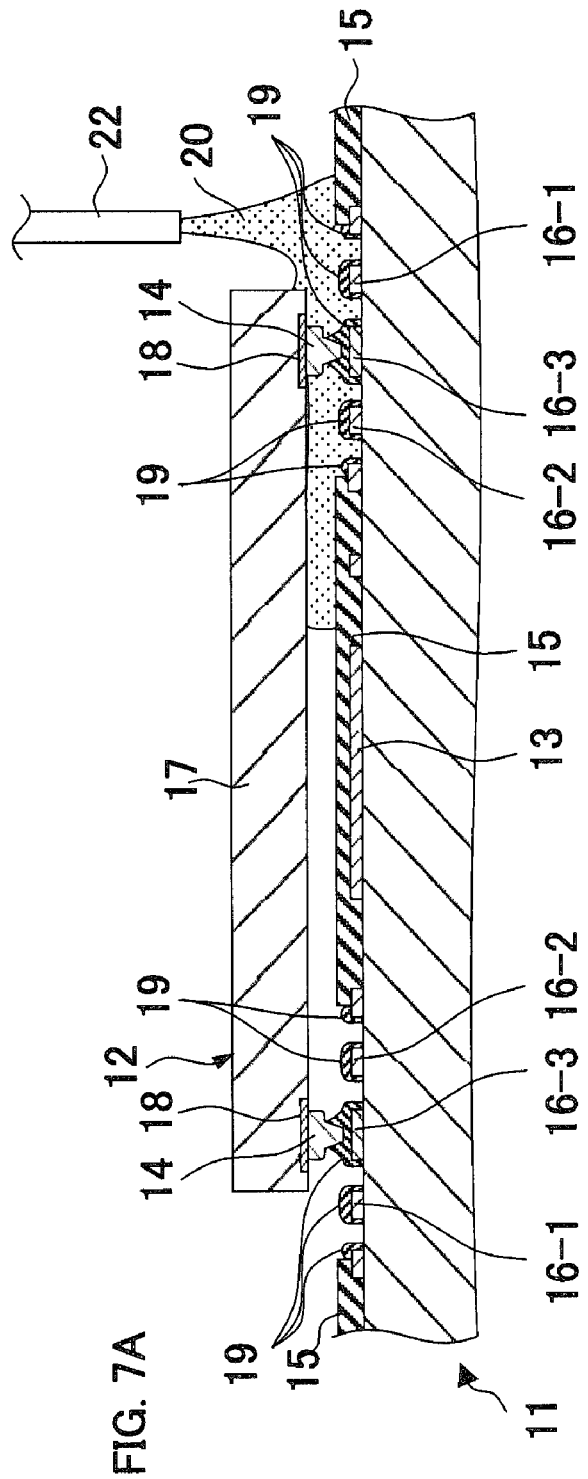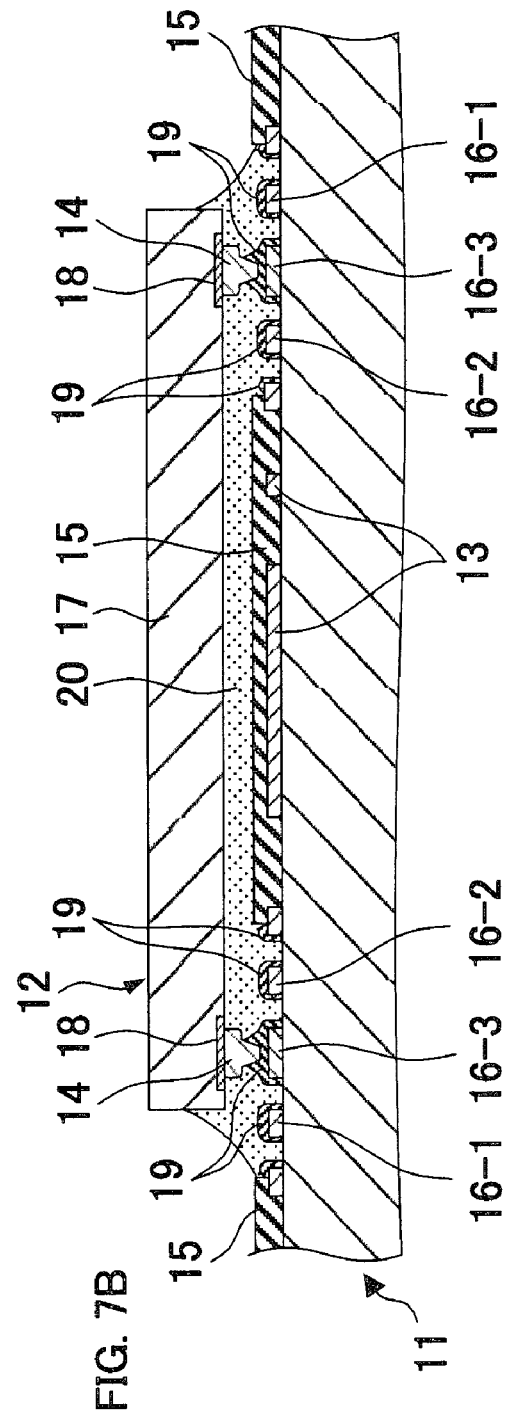

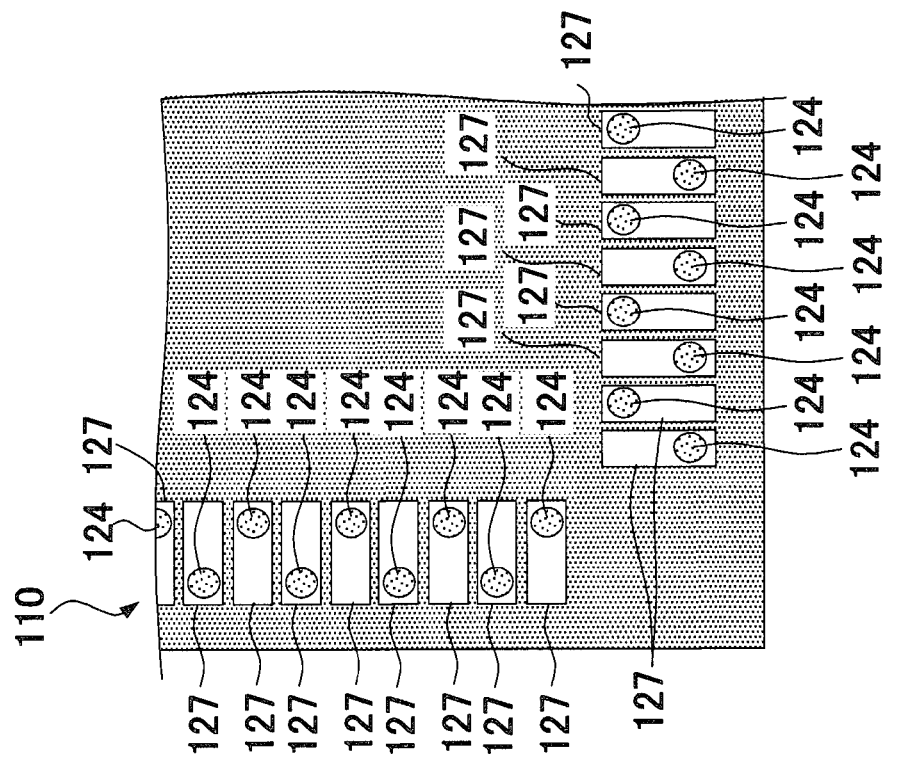
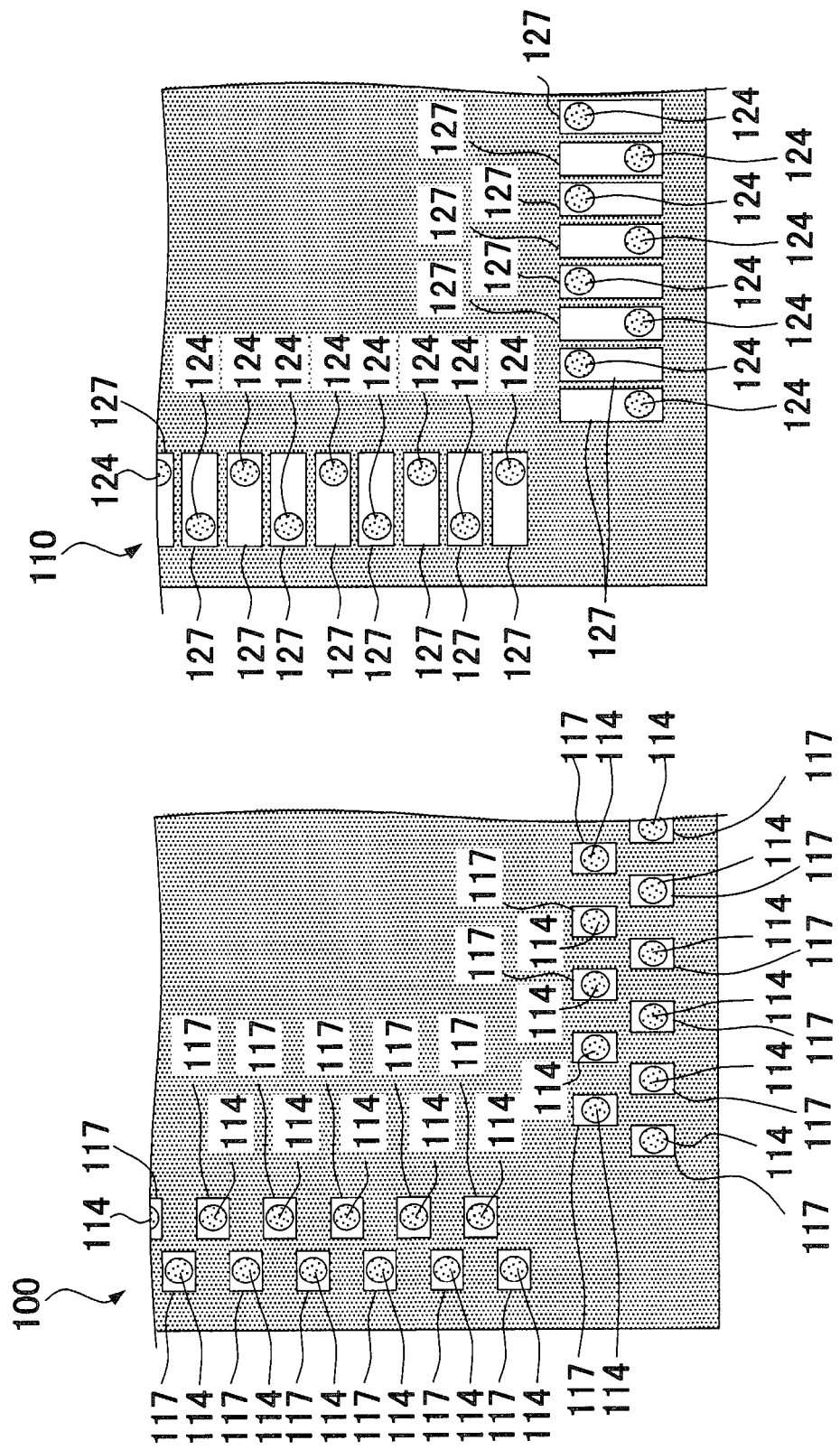

WIRING SUBSTRATE AND ELECTRONIC DEVICE

CROSS-REFERENCE TO RELATED APPLICATIONS

This application is based upon and claims the benefit of priority from the prior Japanese Patent Application No. 2007-61531, filed on Mar. 12, 2007, the entire content of which is incorporated herein by reference.

TECHNICAL FIELD

The present invention relates to a wiring substrate and an electronic component mounting structure.

BACKGROUND

Japanese Patent Laid-Open No. 5-308184 discloses a structure of a circuit board with a solder layer provided on pads constituting a conductive layer, in which the width of a part in the longitudinal direction of each pad is widened, and a solder-banked portion having a solder layer thickness that is larger than those of the other portions is formed on the widened portion.

Japanese Patent Laid-Open No. 6-216507 discloses a structure in which the width of a pad is widened in its middle portion, the center in the length direction of the pad-widened portion is positioned within the range of the length of a flat portion of a component lead, the length of the pad-widened portion is longer than the length of the flat portion of the component lead, and a solder-banked portion having a thickness larger than those of the other portions is formed on the pad-winded portion.

Japanese Utility Model Registration No. 3115062 discloses a circuit pattern formed by selectively coating a wiring pattern with a solder resist, in which the exposed wiring pattern areas are used as electrodes. In this circuit pattern, each electrode is formed so that only one portion in the longitudinal direction of the electrode has a maximum width.

Japanese Patent Laid-Open No. 2000-77471 discloses a structure in which a conductor pattern is formed by a wiring pattern and connection pads to which bumps of a semiconductor element is connected, and the width of each connection pad is larger than the width of each wiring pattern line.

Japanese Patent Laid-Open No. 2004-40056 discloses a structure in which a plurality of wiring pattern lines are arranged in a row on the substrate, first linear portions of the wiring pattern lines are formed in parallel or nonparallel to each other, and second linear portions of the wiring pattern lines are formed on the same straight line.

However, in recent years, semiconductor elements mounted on wiring substrates have been increasingly downsized and have had a larger number of terminals. Also, there has been the demand for high-density mounting of such a semiconductor element on a wiring substrate. Narrowing the pitch of protruded external connection terminals formed on the semiconductor element in order to meet such demand makes the space between the widened portions of electrodes (conductive layer) provided adjacent to each other on the wiring substrate smaller in the approaches in the above-mentioned patent documents.

Accordingly, when mounting the semiconductor element on the wiring substrate, the conductive member provided on the widened portion may run off between the adjacent connection portions formed by the protruded external connection terminals of the semiconductor element and the conductive layer of the wiring substrate. Consequently, between those connection portions, short-circuiting or current leakage may occur, lowering the reliability of electric connection between the protruded external connection terminals of the semiconductor element and the electrodes (conductive layer) of the wiring substrate.

Also, in the structure disclosed in Japanese Patent Laid-Open No. 2004-40056, second linear portions of adjacent wiring pattern lines are arranged on the same straight line in a direction of the wiring pattern line row extending. Accordingly, it is difficult to narrow the pitch between the wiring pattern lines.

SUMMARY

According to an aspect of an embodiment, a wiring substrate includes a plurality of electrode terminals, to which external connection terminals of an electronic component are coupled, arranged in a row on one principal surface thereof, wherein the electrode terminals each include: a first linear portion; a second linear portion extending from an end of the first linear portion in a direction different from a direction of the first linear portion; and a bent portion that is a part where the first linear portion and the second linear portion are connected.

According to an another aspect of an embodiment, an electronic device includes a wiring substrate including a plurality of electrode terminals arranged in a row on one principal surface thereof; and an electronic component mounted on the plurality of electrode terminals via a conductive member, wherein: the electrode terminals each includes a first linear portion, a second linear portion extending from an end of the first linear portion in a direction different from a direction of the first linear portion, and a bent portion that is a part where the first linear portion and the second linear portion are connected; and external connection terminals of the electronic component are coupled to the bent portions of the electrode terminals via the conductive member.

BRIEF DESCRIPTION OF THE DRAWINGS

FIGS. 6A and 6B are cross-sectional views (part 1) for explaining a process of mounting a semiconductor element on the wiring substrate shown in FIG. 1;

FIGS. 7A and 7B are cross-sectional views (part 2) for explaining a process of mounting a semiconductor element on the wiring substrate shown in FIG. 1;

FIGS. 10A and 10B are partial plain views of arrangement structures of external connection terminal pads and protruded external connection terminals of a semiconductor element to be mounted on the wiring substrate shown in FIG. 8 or FIG. 9;

DETAILED DESCRIPTION

First Embodiment

Hereinafter, a first embodiment is described.

Although a semiconductor mounted on a wiring substrate according to the first embodiment is described as an electronic component, the electronic component is not limited to the semiconductor element, and it may be a semiconductor device with a semiconductor element encapsulated by a resin, or a passive element, etc.

Figure 1:
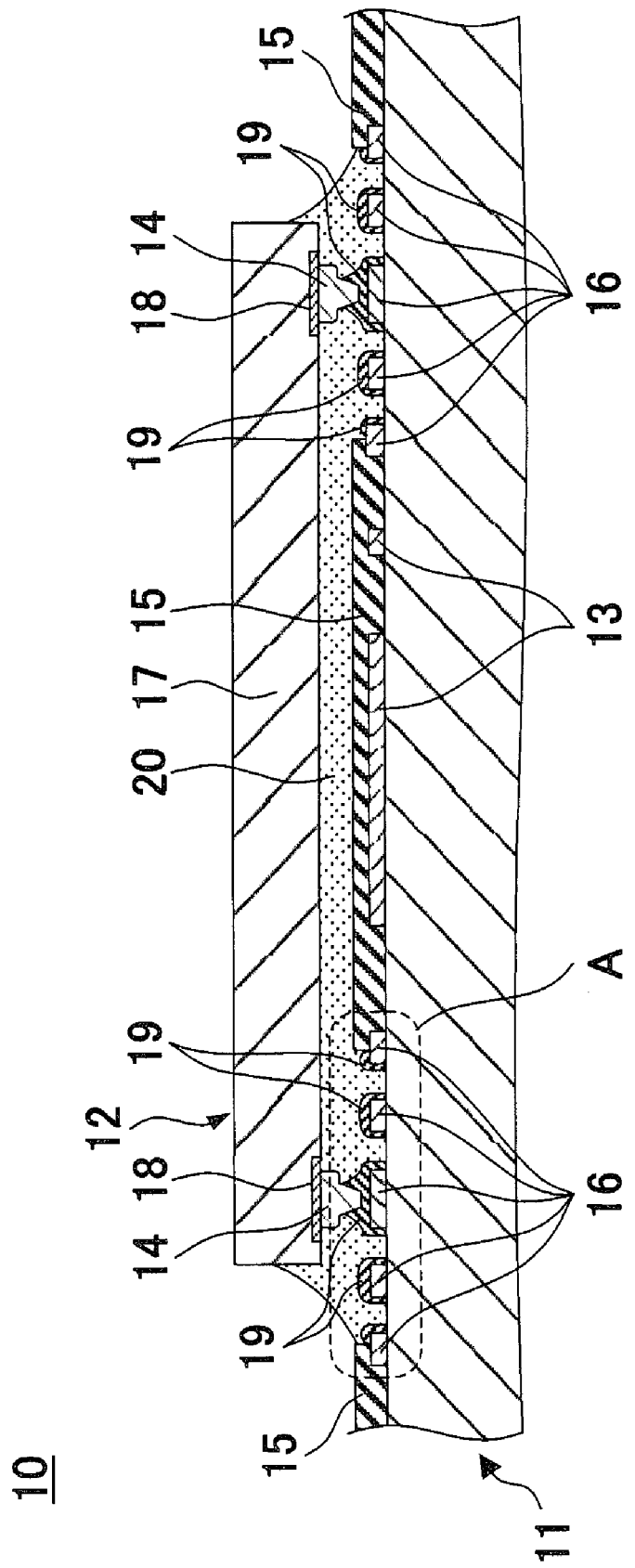
FIG. 1 is a cross-sectional view of a semiconductor device according to a first embodiment.

FIG. 1 is a cross-sectional view of a semiconductor device 10 according to the first embodiment. As shown in the Figure, in the semiconductor device 10, a semiconductor integrated circuit element (hereinafter referred to the "semiconductor element") 12 is mounted by means of a flip-chip (face-down) method on one principal surface (top surface) of a wiring substrate 11.

The wiring substrate 11 has, as its base material, an organic insulating material such as a glass epoxy resin, a glass-BT (bismaleimide triazine) or polyimide, or an inorganic material such as ceramic or glass. A wiring layer including copper (Cu) is selectively provided on a surface or in an inside of the wiring layer. The wiring substrate 11 may also be referred to an interposer or a support substrate.

On that principal surface of the wiring substrate 11 on which the semiconductor element 12 is mounted, a conductive layer 13 connected to the wiring layer is selectively provided. The wiring substrate 11 is selectively coated by a solder resist layer (insulating resin film) 15, excluding the parts to which external connection terminals 14 of the semiconductor element 12 are connected and the areas around the parts. In other words, the solder resist layer 15 selectively coats the conductive layer 13. The solder resist includes a resin such as an epoxy resin, an acrylic resin or a polyimide resin, or a mixture resin thereof, etc.

As a result, parts of the conductive layer 13 are exposed as electrode terminals 16, through openings provided in the solder resist layer 15. The solder resist layer 15 defines the areas of the conductive layer 13 connected to the semiconductor element 12, that is, the portions where the electrode terminals 16 are exposed.

Also, on the other principal surface (rear surface) of the wiring substrate 11, a conductive layer is selectively provided. On the conductive layer, a plurality of external connection terminals, such as solder-based spherical electrode terminals, are provided. In the first embodiment, those external connection terminals are not shown.

The semiconductor element 12 includes semiconductor substrate 17 composed of semiconductor such as silicon (Si), or a semiconductor compound such as gallium arsenide GaAs). Electronic circuits are formed on one principal surface of the semiconductor substrate 17 by means of a known semiconductor manufacture process.

For the semiconductor element 12, the showing of active elements such as transistors, and/or passive elements such as capacitative elements, formed in the semiconductor substrate 17, and a multilayered wiring layer and/or a rewiring layer formed on the one principal surface of the semiconductor element 12 is omitted.

On the one principal surface of the semiconductor substrate 17, external connection terminal pads 18 are arranged in rows around the electronic circuit portions. The protruded external connection terminals 14 are arranged on the respective external connection terminal pads 18.

The external connection terminal pads 18 are formed of aluminum (Al), copper (Cu) or an alloy thereof, etc. Each protruded external connection terminal 14 is formed by means of, for example, what is called ball-bonding method, and has a base portion including a gold (Au) ball fixed and adhered to an external connection terminal pad 18, and a protruded portion projecting from the base portion. The base portion and the protruded portion are integrally formed. Also, a top of the protruded external connection terminal 14 is subjected to planarization processing as needed.

On a surface (the top layer) of the external connection terminal pads 18, a gold (Au) layer may be formed in advance by means of electrolytic plating or vapor deposition, etc.

The protruded external connection terminals 14 may be formed of, for example, copper (Cu), or an alloy of copper (Cu) and gold (Au), or solder, etc.

At least protruded portions of the protruded external connection terminals 14 on the semiconductor element 12, and the corresponding electrode terminals 16 on the wiring substrate 11 are coated in common by a conductive member 19 having remelting capability and are mechanically and electrically connected to each other.

As a material of the conductive member 19, solder is used. Solder has remelting capability, but exhibits high fluidity when it is melted as a result of heating, compared to other conductive materials having remelting capability such as a conductive resin adhesive, and is favorable for a material for the conductive member 19. Also, when using solder as the conductive member 19, a solder material for pre-coating wiring substrate 11 can be used as the conductive member 19. This is convenient because a solder pre-coating technique can be used, and also, expensive material costs can be avoided.

Between the semiconductor element 12 mounted and fixed in a flip-chip (face-down) method on the one principal surface of the wiring substrate 11 as described above, and the one principal surface of the wiring substrate 11, an underfill material 20 is filled. For the underfill resin material 20, a thermosetting adhesive, such as an epoxy resin, a polyimide resin, or an acrylic resin, etc. is used.

A structure of the electrode terminals 16 is described with reference to FIGS. 2-4.

Figure 2:
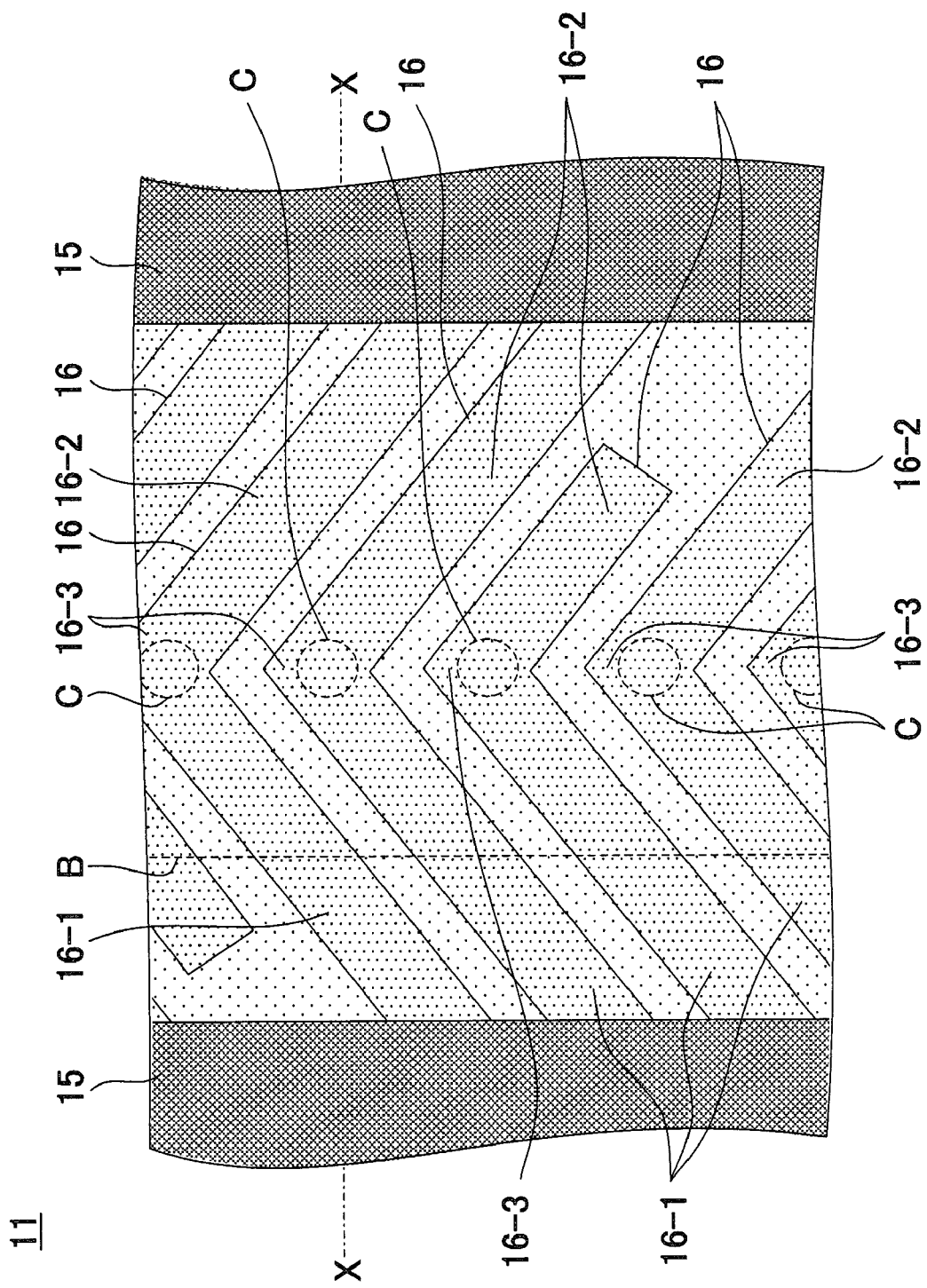
FIG. 2 is a plain view of a planar configuration of the part circled by dashed line A in the wiring substrate shown in FIG. 1.
Figure 3:
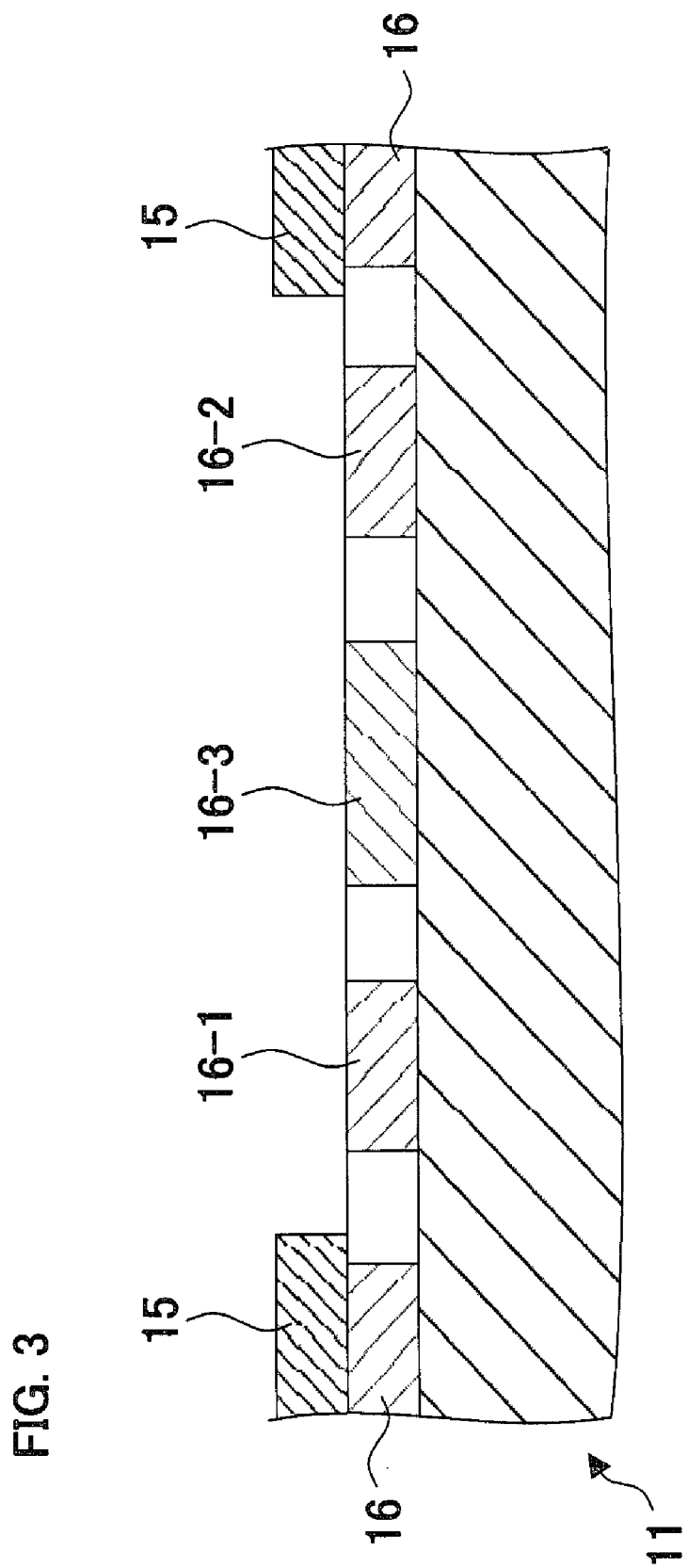
FIG. 3 is a diagram illustrating a cross-section taken along line X-X in the wiring substrate shown in FIG. 2.

FIG. 2 is a planar view of the inside portion indicated using dashed line A in FIG. 1. In the Figure, the semiconductor element 12 and the underfill material 20 are omitted. FIG. 3 is a cross-sectional view of the wiring substrate 11 along line X-X in FIG. 2.

As shown in FIG. 2, the solder resist layer 15 is provided so that it selectively coats the plurality of conductive layers 13 arranged on the one principal surface of the wiring substrate 11. The parts of the conductive layers 13 not coated by the solder resist layer 15 are exposed as the electrode terminals 16.

In the Figure, dashed line B indicates an outer peripheral edge of the semiconductor element 12 to be mounted by means of flip-chip bonding on the wiring substrate 11, and dashed line circle C indicates a connection part of an electrode terminal 16 to which a protruded external connection terminal 14 of the semiconductor element 12 is connected. In other words, the semiconductor element is positioned on the right side of dashed line B.

Each electrode terminal 16 includes a first linear portion 16-1, a second linear portion 16-2 extending from an end of the first linear portion 16-1 in a direction that is different from the first linear portion 16-1, and a bent portion 16-3 where the first linear portion 16-1 and the second linear portion 16-2 are connected. First linear portions 16-1 adjacent to each other are arranged in parallel to each other. Also, second linear portions 16-2 adjacent to each other are arranged in parallel to each other.

The first linear portion 16-1 and the second linear portion 16-2 are connected at a predetermined angle (obtuse angle in the first embodiment). The bent portion 16-3 is bended in a V-letter shape. A protruded external connection terminal 14 of the semiconductor element 12 is connected to the bent portion 16-3.

The bent portions 16-3 of electrode terminals 16 are arranged in the same straight line, and the arrangement corresponds to the arrangement of the external connection terminal pads 18 of the semiconductor element 12.

Figure 4:
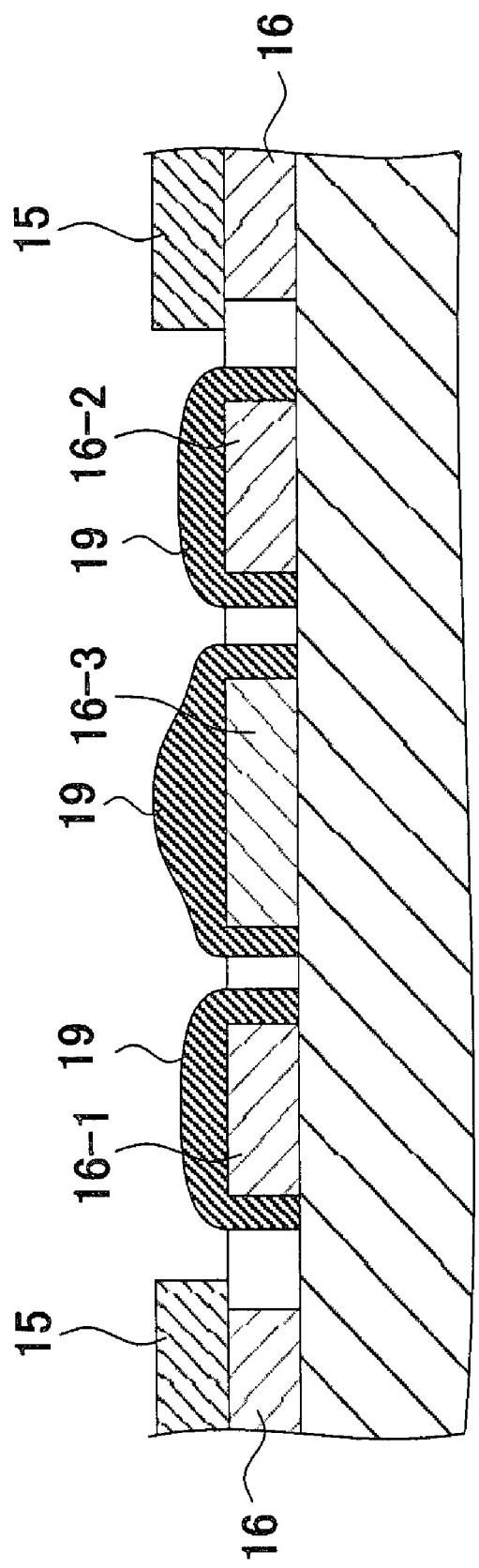
FIG. 4 is a cross-sectional view illustrating a state in which a conductive member is coated on electrode terminals on the wiring substrate shown in FIG. 3.

FIG. 4 shows a state in which the electrode terminals 16 are coated by the conductive member 19.

As described above, the conductive member 19 having remelting capability is arranged on surfaces of the electrode terminals 16, and the protruded external connection terminals 14 of the semiconductor element 12 are fixed and connected thereto via the conductive member 19.

As shown in FIG. 4, the thickness of the conductive member 19 disposed on the bent portion 16-3 of the electrode terminal 16 is greater than that of each conductive member 19 disposed on the first linear portion 16-1 and the second linear portion 16-2.

Figure 5A:
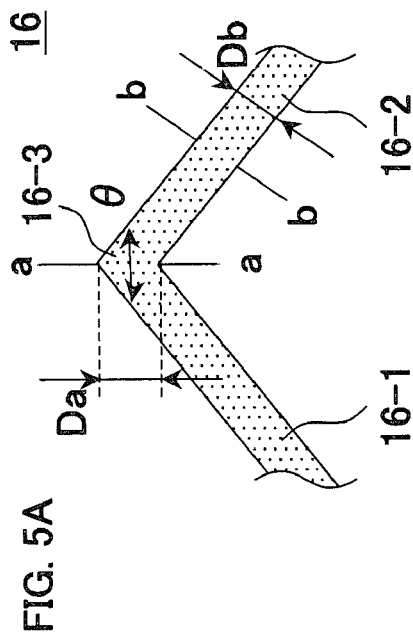
FIGS. 5A to 5C are diagrams for explaining the thickness of a conductive member provided on a bent portion of an electrode terminal on a wiring substrate, and the thicknesses of conductive members provided on a first linear portion and a second linear portion.
Figure 5C:
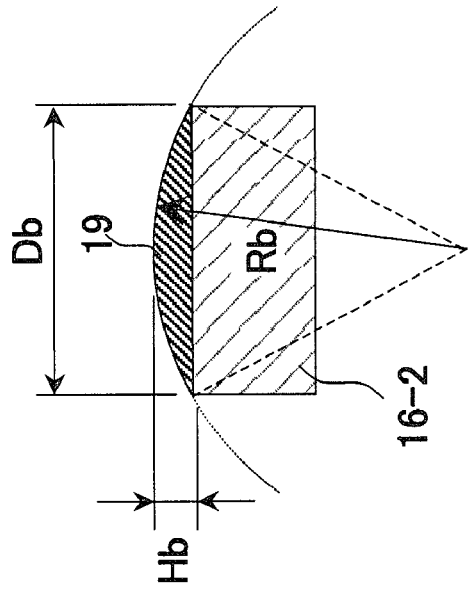
Figure 5B:
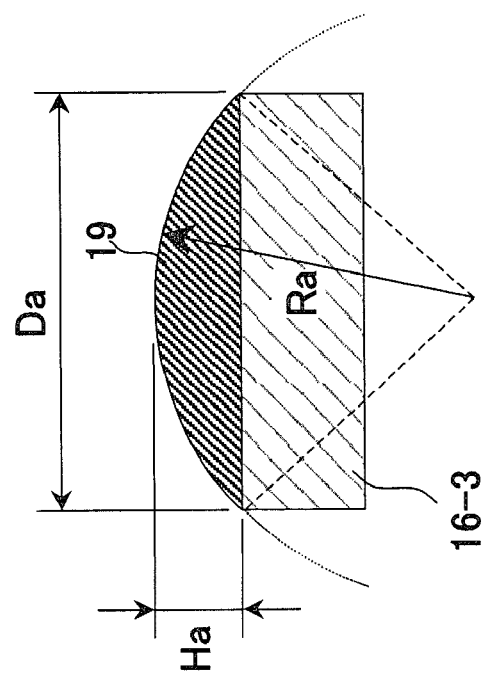

The reason why a difference in thickness of the conductive member 19 occurs in one electrode terminal 16 will be explained with reference to FIG. 5. FIG. 5A shows one of the electrode terminals 16, FIG. 5B is a cross-sectional view of the bent portion 16-3 of the electrode terminal 16 (cross-sectional view along line a-a in FIG. 5A), and FIG. 5C is a cross-sectional view of one linear portion 16-2 of the electrode terminal 16 (cross-sectional view along line b-b in FIG. 5A). FIG. 5C shows the cross-section of one linear portion 16-2, but the other linear portion 16-1 has a similar cross-sectional structure.

Here, it is assumed that the surface tension of the conductive member 19 is $\gamma$, and that the external air pressure is Po. It is also assumed that the internal pressure of the conductive member 19 in the cross-section along line a-a in FIG. 5A is Pa, and that the internal pressure of the conductive member 19 in the cross-section along line b-b in FIG. 5A is Pb. It is further assumed that the curvature radius of the conductive member 19 in the cross-section along line a-a in FIG. 5A is Ra, and the curvature radius of the conductive member 19 in the cross-section along line b-b in FIG. 5A is Rb.

Expressions (1) and (2) can be formulated by Laplace's theorem related to surface tension:

$$\Delta Pa = Po - Pa = 2\gamma/Ra \qquad \text{Expression (1); and}$$

$$\Delta Pb = Po - Pb = 2\gamma/Rb \qquad \text{Expression (2).}$$

When the conductive member 19 is melted and enters an equilibrium state as a result of its surface tension being exerted, the internal pressure Pa of the conductive member 19 in the bent portion 16-3 and the internal pressure Pb of the conductive member 19 in the second linear portion 16-2 are equal to each other, and accordingly, expression (3) can be obtained from expressions (1) and (2):

$$Rb = Ra \qquad \text{Expression (3).}$$

Meanwhile, the following relational expression (4) can be formulated for a flexion angle $\theta$ of the bent portion 16-3, the width (maximum width) Da of the bent portion 16-3, and the width Db of the second linear portion 16-2:

$$Da = [1/\{\sin(0.5\theta)\}] \times Db \qquad \text{Expression (4).}$$

In this expression, the flexion angle $\theta$ of the bent portion 16-3 is 0 degrees$<\theta<$180 degrees, and in this range, the following relational expression (5) can be obtained from expression (4):

$$Da > Db \qquad \text{Expression (5).}$$

Based on expressions (3) and (5) above, when the conductive member 19 is in an equilibrium and melted state, the following relational expression (6) can be obtained for the thickness Ha of the conductive member 19 in the cross-section of the bent portion 16-3 (cross-section along line a-a of FIG. 5A), and the thickness Hb of the conductive member 19 in the cross-section of the second linear portion 16-2 (cross-section along line b-b of FIG. 5A):

$$Ha > Hb \qquad \text{Expression (6).}$$

As described above, the height (thickness) of the conductive member 19 on the bent portion 16-3 of the electrode terminal 16 becomes great compared to the first linear portion 16-1 and the second linear portion 16-2.

Also, since the influence of gravity becomes smaller as the electrode terminal 16 is miniaturized, the influence of gravity exerted on the conductive member 19 is ignored in the explanation of expressions (1) to (6) for easy understanding of the action principle. Furthermore, for the conductive member 19, one that can be applied only to the top surface portion of the electrode terminal 16 and has a constant curvature radius is used.

As described above, as a result of the effective width of the electrode terminal 16 varying, the thickness (height) of the conductive member 19 disposed on the surface of the electrode terminal 16 also varies. In other words, as shown in FIG. 4, after the conductive member 19 is disposed on the electrode terminal 16, it is heated to enhance its fluidity, and the conductive member 19 that has become liquid has the maximum thickness at the bent portion 16-3 due to its surface tension.

As a result of the temperature of the conductive member 19 being lowered or the conductive member 19 being solidified, the conductive member 19 is formed so that the conductive member 19 has a great thickness at the bent portion 16-3 compared to the first linear portion 16-1 and the second linear portion 16-2.

In other words, when forming the conductive member 19 on the electrode terminal 16 by means of coating, the coating thickness (height) of the conductive member 19 at the bent portion 16-3, which is the part of the electrode terminal 16 to which a protruded external connection terminal 14 of the semiconductor element 12 is connected, can be formed to be thick (high).

As described above, in the first embodiment, when connecting the protruded external connection terminals 14 of the semiconductor element 12 to the electrode terminals 16 of the wiring substrate 11, a conductive member 19 having a sufficient amount (thickness) can be disposed, thereby non-uniformity of the heights of the protruded external connection terminals 14 and/or warpage of the wiring substrate 11 can be absorbed. Consequently, when mounting the semiconductor element 12 on the wiring substrate 11 by means of flip-chip bonding, its connection stability (yield) can be enhanced.

Also, by making the flexion angle of the bent portion 16-3 of the electrode terminal 16 to be an acute angle, the height of the conductive member 19 at the relevant local portion 16-3 can be made greater, but the flexion angle can be arbitrarily selected based on the width or mutual pitch of the electrode terminals, etc.

As described above, the conductive member 19 is formed having a great thickness at the bent portion 16-3 of the electrode terminal 16. Accordingly, even when the pitch of the protruded external connection terminals 14 of the semiconductor element 12 is narrowed, and the width of the electrode terminals 16 of the wiring substrate 11 is narrowed in response to this, a great connection strength can be achieved for the connection with the protruded external connection terminals 14.

Also, the non-uniformity of the heights of the protruded external connection terminals 14 of the semiconductor element 12, or warpage of the wiring substrate 11 is absorbed, ensuring reliable electric connection between the protruded external connection terminals 14 of the semiconductor element 12 and the bonding electrodes 16 of the wiring substrate 11.

Meanwhile, the plurality of electrode terminals 16 are arranged with their first linear portions 16-1 in parallel to each other, and also with the their second linear portion 16-2 in parallel to each other, so a high arrangement density can be obtained for the electrode terminals 16 on the wiring substrate 11.

Also, even though the arrangement pitch of the protruded external connection terminals 14 of the semiconductor element 12 is narrowed, the width of the electrode terminals 16 on the wiring substrate 11 is also miniaturized in response to this, short-circuiting between the electrode terminals or current leakage can be prevented when mounting the semiconductor element 12 on the wiring substrate 11 by means of flip-chip bonding, and consequently, a highly-reliable mounting structure can be achieved.

Next, a process of mounting the semiconductor element 12 on the wiring substrate 11 is described with references to FIGS. 6 and 7.

First, the wiring substrate 11 mounted and fixed on a bodding stage (not shown) and the semiconductor element 12 sticking to and held by a sucking tool 21 are made to face each other (see FIG. 6A).

The wiring substrate 11, as described above, has, as its base material, an organic insulating material such as a glass epoxy resin, a glass-BT (bismaleimide triazine) or polyimide, or an inorganic material such as ceramic or glass, and on a surface thereof or in the inside thereof, a wiring layer comprising copper (Cu), etc., is selectively provided.

On one (top) principal surface of the wiring substrate 11, a conductive layer 13 connected to the wiring layer is provided. The conductive layer 13 is selectively coated by a solder resist layer (insulating resin film) 15, and at openings of the solder resist layer 15, a plurality of electrode terminals 16 are exposed.

The electrode terminals 16 are formed by means of what is called photo-etching, or selective plating, etc., and formed into a pattern according to the idea of the first embodiment as shown in FIG. 2. In other words, each electrode terminal 16 includes a first linear portion 16-1, and a second linear portion 16-2, and the first linear portion 16-1 and the second linear portion 16-2 are connected via a bent portion 16-3 having a predetermined angle.

Meanwhile, the semiconductor element 12 has protruded external connection terminals 14 on external connection terminal pads 18 arranged on a principal surface of a silicon (Si) semiconductor substrate 17.

The external connection terminal pads 18 are generally formed of aluminum (Al), copper (Cu) or an alloy thereof, etc. Each protruded external connection terminal 14 is integrally formed having a base portion formed by a gold (Au) ball being fixed and connected to a surface of an external connection terminal pad 18 by means of what is called ball-bonding, and a protruded portion comprising a projecting part on the base portion.

Also, the top of the protruded external connection terminal 14 may be subjected to planarization processing.

For forming the protruded external connection terminal 14 on the surface of the external connection terminal pad 18, a method in which gold (Au), copper (Cu) or nickel (Ni), etc., is deposited by means of electrolytic plating or non-electrolytic plating may be employed.

Furthermore, on the exposed surface (top layer) of the external connection terminal pad 18, a gold (Au) layer may be formed by means of electrolytic plating or vapor deposition, etc.

Meanwhile, on each electrode terminal 16 of the wiring substrate 11, a conductive member 19 formed of solder based on, for example, tin (Sn) is applied and formed in advance by means of printing, plating or vapor deposition and reflow, etc.

Here, the thickness (height in the vertical direction) of the conductive member 19 provided on the bent portion 16-3 of the electrode terminal 16, as described above, is greater than the thickness of each conductive member 19 provided on the first linear portion 16-1 and the second linear portion 16-2.

The external connection terminals 14 of the semiconductor element 12 having the above-described electrode structure are aligned with the bent portions 16-3 of the electrode terminals 16 of the wiring substrate 11 so as to face them.

The above sucking tool 21 is pre-heated to a temperature equal to or exceeding the melting point of the conductive member 19 (e.g. 180° C. to 260° C.) using heating means (not shown).

In that state, the sucking tool 21 that sucks and holds the semiconductor element 12 is lowered to make the protruded external connection terminals 14 of the semiconductor element 12 in contact with the conductive member 19 covering surfaces of the electrode terminals 16 of the wiring substrate 11, and then weight is applied by the sucking tool 21 to make the conductive member 19 melt.

As a result, at least the projecting portions of the protruded external connection terminals 14 of the semiconductor element 12 are coated by the conductive member 19, and the protruded external connection terminals 14 of the semiconductor element 12 and the electrode terminals 16 of the wiring substrate 11 are connected via the conductive member 19 (see FIG. 6B).

Also, it is possible to increase the temperature of the conductive member 19 in a short period of time by pre-heating the bonding stage to a temperature of around 50° C. to 100° C. to pre-heat the wiring substrate 11.

As described above, the protruded external connection terminals 14 of the semiconductor element 12 are connected and fixed to the bent portions 16-3 of the electrode terminals 16 on the wiring substrate 11, and the semiconductor element 12 is mounted on the wiring substrate 11, and then, an underfill material 20 such as a thermosetting adhesive comprising an epoxy resin, a polyimide resin, or an acrylic resin, etc., is filled between the wiring substrate 11 and the semiconductor element 12 (see FIG. 7A).

The underfill material 20 is supplied via a nozzle 22.

As described above, on the one principal surface of the wiring substrate 11, the semiconductor element 12 is mounted and fixed by means of a flip-chip (face-down) method, and the protruded external connection terminals 14 of the semiconductor element 12 and the corresponding electrode terminals 16 of the wiring substrate 11 are mechanically and electrically connected via the conductive member 19 (see FIG. 7B).

Subsequently, on the other principal surface (lower surface) of the wiring substrate 11, external connection terminals such as solder-based spherical electrode terminals are arranged (not shown) to form a semiconductor device 10.

According to the first embodiment, the configuration of the electrode terminals on the wiring substrate, and the arrangement structure of the external connection terminals of the semiconductor element are not limited to the structures shown in FIG. 2, but structures like those described in the following modifications can also be employed.

Second Embodiment

Figure 8:
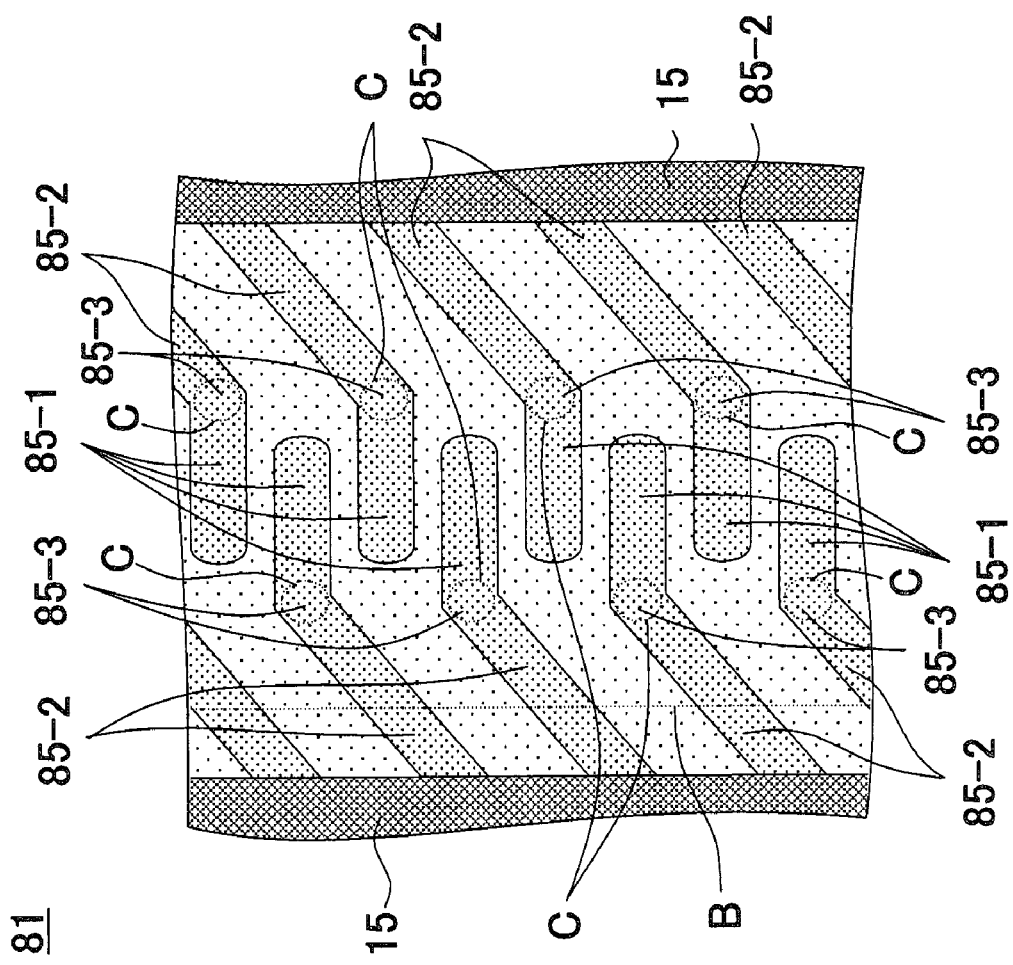
FIG. 8 is a partial plain view of electrode terminals on a wiring substrate according to a second embodiment.

FIG. 8 shows the configuration of electrode terminals on a wiring substrate according to a second embodiment. In the Figure, dashed line B indicates an outer peripheral edge of a semiconductor element to be mounted on a wiring substrate 81, and dashed line circle C indicates a part in which a protruded external connection terminal of the semiconductor element is connected to an electrode terminal of the wiring substrate. In other words, the semiconductor element is positioned on the right side of dashed line B.

In the second embodiment, also, a plurality of electrode terminals 85 arranged on the wiring substrate 81 each include a first linear portion 85-1 and a second linear portion 85-2 that have a fixed width and are connected to each other. The first linear portion 85-1 and the second linear portion 85-2 are connected via a bent portion 85-3 constituting an obtuse angle, and extend in directions that are different from each other.

In such configuration, the first linear portion 85-1 of each electrode terminals 85 has a relatively-short linear shape (strip-shape), and a plurality of first linear portions 85-1 are arranged in a direction along the outer peripheral edge of the semiconductor element in parallel to each other.

Meanwhile, each second linear portion 85-2 is arranged by connecting to one end of a first linear portion 85-1 via a bent portion 85-3, and such bent portions 85-3 arranged on the plurality of first linear portions 85-1 with their positions alternately changed, and as a result, the second linear portions 85-2 extend in different directions (lower leftward and upper rightward directions in the shown structure) for every other first linear portion 85-1.

In other words, one ends and the other ends of the plurality of the first linear portions 85-1 arranged in a direction along the outer peripheral edge of the semiconductor element are alternately selected, and from those selected ends, the second linear portions 85-2 extend.

Accordingly, the bent portions 85-3, that is, the parts to which the external connection terminals of the semiconductor element are connected are alternately provided having different distances from the outer peripheral edge of the semiconductor element. Consequently, it is possible to effectively increase the distance between adjacent bent portions 85-3, and to effectively increase the pitch of the external connection terminals of the semiconductor element that are connected to the bent portions 85-3 in a direction along the outer peripheral edge of the semiconductor element. Also, the second linear portions 85-2 extending in the same direction are arranged so that they are in parallel to each other.

Third Embodiment

Figure 9:
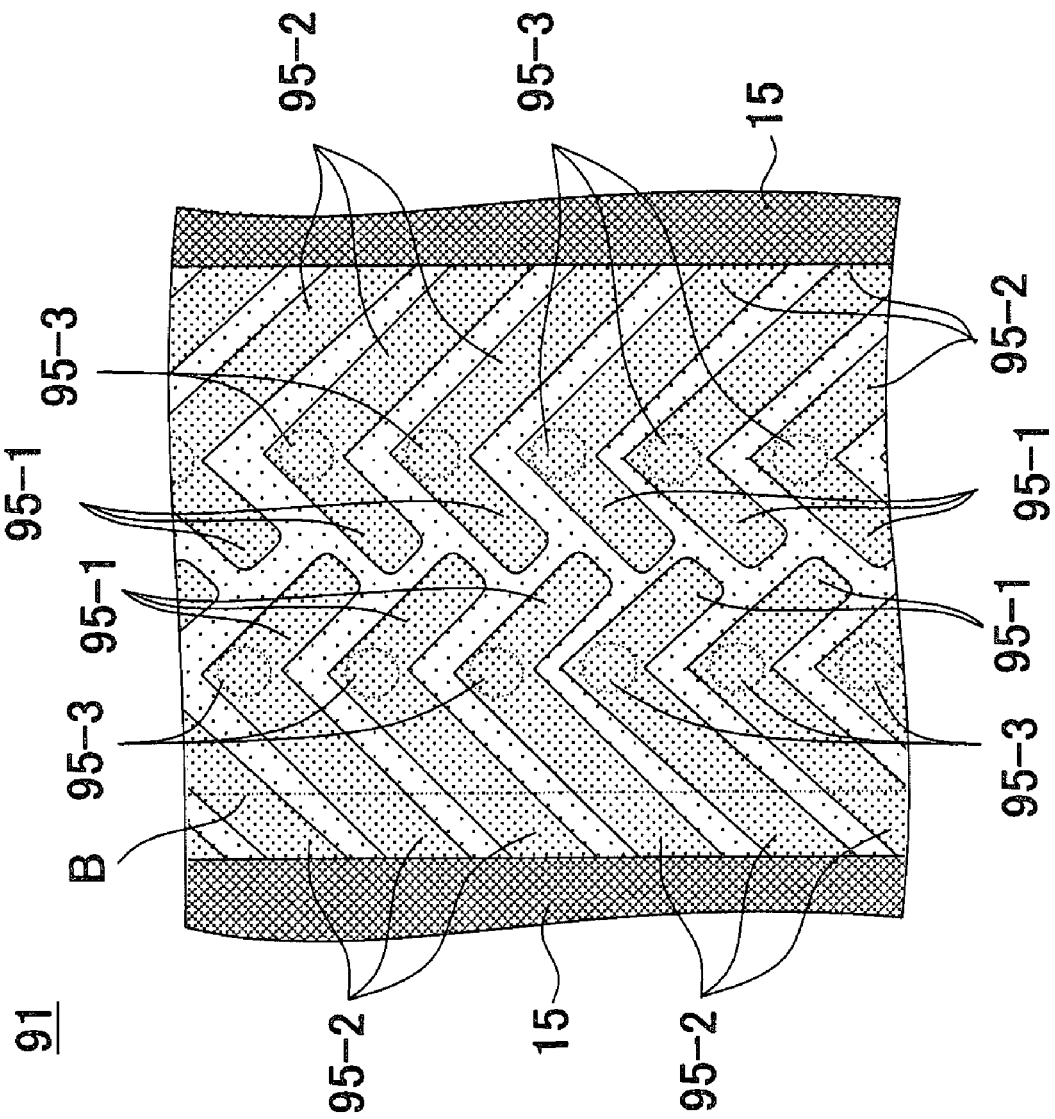
FIG. 9 is a partial plain view of electrode terminals on a wiring substrate according to a third embodiment.

FIG. 9 shows the configuration of electrode terminals of a wiring substrate according to a third embodiment. In the Figure, dashed line B indicates an outer peripheral edge of a semiconductor element to be mounted on a wiring substrate 91. In other words, the semiconductor element is positioned on the right side of dashed line B. Also, a part where a protruded external connection terminal of the semiconductor element is connected to an electrode terminal on the wiring substrate is indicated by a dashed line circle.

In the third embodiment, also, a plurality of electrode terminals 95 arranged on the wiring substrate 91 each include a first linear portion 95-1 and a second linear portion 95-2 that have a fixed width and are connected to each other. The first linear portion 95-1 and the second linear portion 95-2 are connected via a bent portion 95-3 constituting an obtuse angle, and extend in directions that are different from each other.

In such configuration, the first linear portions 95-1 of the electrode terminals 95 have a relatively-short linear shape (strip-shape) as those in the second embodiment above do. They are arranged with inclinations in two rows in a direction along the outer peripheral edge of the semiconductor element, and in each row, they are arranged in parallel to each other.

The first linear portions 95-1 of the electrode terminals 95 arranged in two rows have different inclination directions for the respective rows, and ends of the first linear portions 95-1 of the electrode terminals 95 constituting one of the rows are arranged near ends of the first linear portion 95-1 of the electrode terminals 95 constituting the other of the rows.

Meanwhile, the second linear portions 95-2 are arranged so that they are connected to the other ends, i.e., the ends on the side far from the other row, of the first linear portions 95-1 via the bent portions 95-3. The second linear portions 95-2 extend in directions going away from the rows.

In other words, the second linear portions 95-2 extend from one ends (ends far from the other row) of the plurality of first linear portions 95-1 arranged with inclinations in two rows in a direction along the outer peripheral edge of the semiconductor element.

Accordingly, the bent portions 95-3, that is, the parts to which the protruded connection terminals of the semiconductor element are connected are alternately provided having different distances from the outer peripheral edge of the semiconductor element.

Accordingly, it is possible to effectively increase the distance between adjacent bent portions 95-3, and also to effectively increase the pitch in a direction along the outer peripheral edge of the semiconductor element of the external connection terminals of the semiconductor element that are connected to the bent portions 95-3.

Meanwhile, the second linear portions 95-2 extending in the same direction are arranged so that they are in parallel to each other.

FIGS. 10A and 10B illustrate an arrangement structure of external connection terminal pads and protruded external connection terminals of a semiconductor element to be mounted on a wiring substrate having the above-described electrode terminal arrangement structure (second embodiment and third embodiment). FIGS. 10A and 10B each illustrate one corner portion of a semiconductor element.

In the example shown in FIG. 10A, a plurality of external connection terminal pads 117 are arranged in two rows along a linear outer peripheral edge of a semiconductor element 100 and in a manner in which their distances from that linear outer peripheral edge are different for each row.

In each of the external connection terminal pads 117, a protruded external connection terminal 114 is arranged. In other words, the semiconductor element 100 has two mutually-parallel rows of protruded external connection terminals 114 formed along its outer peripheral edge.

Meanwhile, in the example shown in FIG. 10B, rectangular external connection terminal pads 127 extending from an outer peripheral edge portion of the semiconductor element 110 toward the inside thereof are arranged in rows along a linear outer peripheral edge of the semiconductor element.

In adjacent rectangular external connection terminal pads 127, protruded external connection terminals 124 are alternately arranged on different ends in the length direction of the rectangular, that is, either an end close to the linear outer peripheral edge of the semiconductor element or an end on the side far from the linear outer peripheral edge. In other words, the semiconductor element 110 also has two mutually-parallel rows of protruded external connection terminals 124 formed along its outer peripheral edge.

When mounting a semiconductor element having the above-described protruded external connection terminal arrangement on the wiring substrate (81 or 91) shown in FIG. 8 or FIG. 9 by means of flip-chip boding, the protruded external connection terminals arranged in two rows along a linear outer peripheral edge of the semiconductor element are connected to the bent portions (85-3 or 95-3) of the electrode terminals arranged in two rows on the wiring substrate.

At this time, in each of the bent portions in two rows, a protruded external connection terminal is firmly connected and fixed to the bent portion by means of a thickly-disposed (i.e., a large amount of) conductive member. Also, non-uniformity of heights of the protruded external connection terminals, or warpage of the wiring substrate can be absorbed. Consequently, the semiconductor element and the electrode terminals on the wiring substrate are connected with high connection stability (yield) and high connection reliability.

Also, as described above, the bent portions of the electrode terminals arranged in rows on the wiring substrate, that is, the parts to which the external connection terminals are connected are alternately provided between the rows with the respective adjacent bent portions having different distances from the outer peripheral edge of the semiconductor element.

Accordingly, the distance between the adjacent bent portions is large in effect, making it possible to effectively increase the pitch of the external connection terminals on the semiconductor element that are connected to the bent portions. As a result, a dielectric strength voltage between the external connection terminals can be ensured, enabling the mounting of a semiconductor element including external connection terminals in high density by means of flip-chip bonding.

Fourth Embodiment

Figure 11:
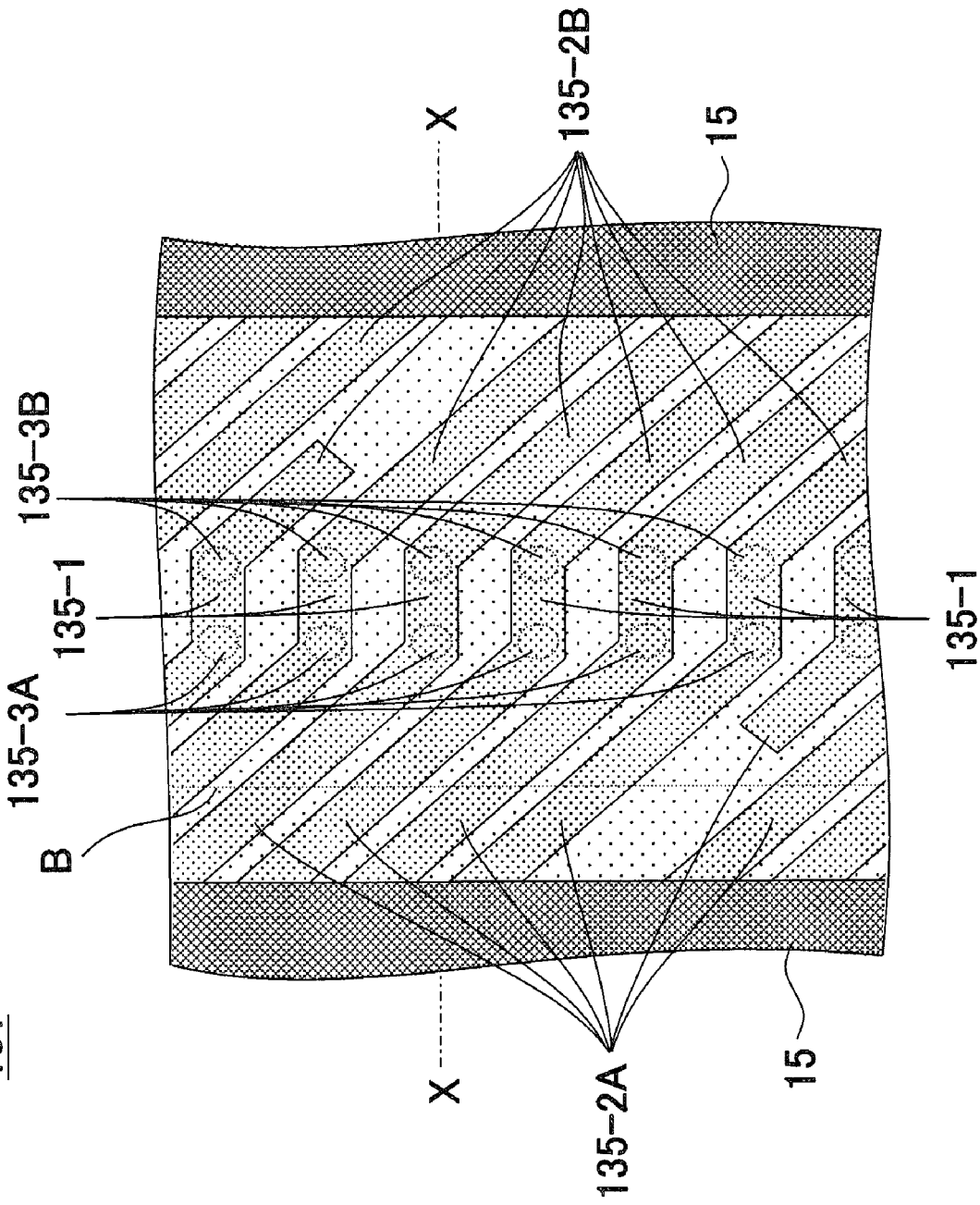
FIG. 11 is a partial plain view of electrode terminals on a wiring substrate according to a fourth embodiment.

FIG. 11 shows the configuration of electrode terminals of a wiring substrate according to a fourth embodiment. In the Figure, dashed line B indicates an outer peripheral edge of a semiconductor element mounted on a wiring substrate 131. In other words, the semiconductor element is positioned on the right side of dashed line B. A dashed line circle indicates a part where a protruded external connection terminal of the semiconductor element is connected to an electrode terminal on the wiring substrate.

In this fourth embodiment, a plurality of electrode terminals 135 arranged on the wiring substrate 131 each include a first linear portion 135-1 having a fixed width and second linear portions 135-2A, 135-2B extending from both ends of the relevant first linear portion 135-1.

A plurality of first linear portions 135-1 are arranged in a direction along the outer peripheral edge of the semiconductor element, and two second linear portions 135-2A, 135-2B are connected to each other via bent portions 135-3A, 135-3B, each constituting an obtuse angle, at both ends of the first linear portion 135-1, and they extend in directions that are different from each other. According to this configuration, two bent portions, that is, parts to which protruded external connection terminals of the semiconductor element are connected are provided for one electrode wiring 135.

At this time, the first linear portions 135-1 arranged along the outer peripheral edge of the semiconductor element have the same length, so the bent portions 135-3A, 135-3B are arranged in parallel to each other along the outer peripheral edge of the semiconductor element, forming rows.

In the Figure, reference numeral 15 denotes a solder resist layer.

Figure 12:
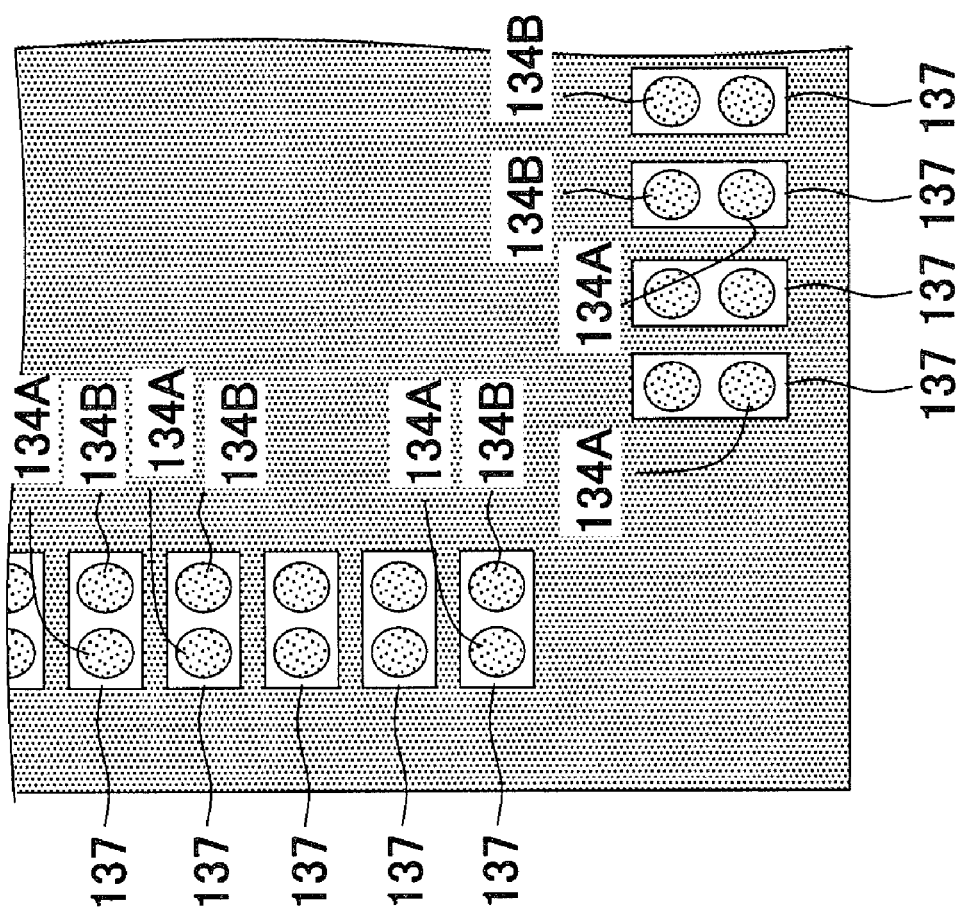
FIG. 12 is a partial plain view of an arrangement structure of external connection terminal pads and protruded external connection terminals on a semiconductor element to be mounted on the wiring substrate shown in FIG. 11.

FIG. 12 shows an arrangement structure of external connection terminal pads and protruded external connection terminals of a semiconductor element to be mounted by means of flip-chip bonding on the wiring substrate 131 having the above-described electrode terminal arrangement structure. FIG. 12 also illustrates one corner portion of a semiconductor element. In other words, a plurality of rectangular external connection terminal pads 137 extending from the outer peripheral edge portion toward the inside are arranged in a row and in parallel to each other along one linear outer peripheral edge of a semiconductor element 132.

In one rectangular external connection terminal pad 137, two protruded external connection terminals 134A, 134B are aligned in the longitudinal direction of the rectangle. In other words, the semiconductor element 132 also has two rows of mutually-parallel protruded external connection terminals 134 arranged along one linear peripheral edge thereof.

Figure 13:
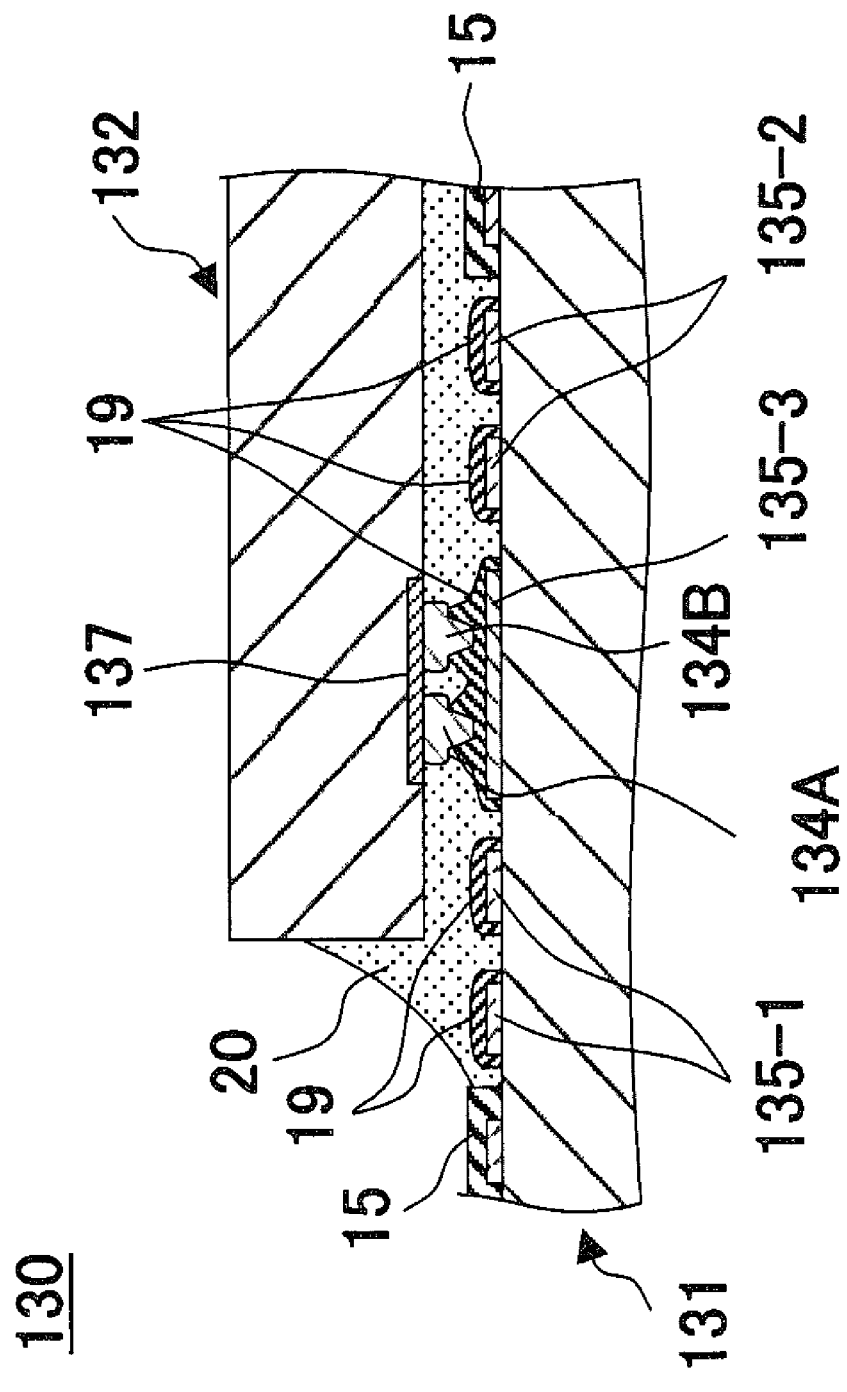
FIG. 13 is a cross-sectional view of a structure in which the semiconductor element shown in FIG. 12 is mounted on the wiring substrate shown in FIG. 11.

FIG. 13 shows a state in which the semiconductor element 132 having the above-described protruded external connection terminal arrangement structure is mounted by means of flip-chip bonding on the wiring substrate 131.

In other words, on one principal surface of the wiring substrate 131, the semiconductor element 132 is mounted by means of a flip-chip (face-down) method, and the protruded external connection terminals 134 of the semiconductor element 132 and the corresponding electrode terminals 135 on the wiring substrate 131 are mechanically and electrically connected via the conductive member 19.

Here, two protruded external connection terminals 134A, 134B arranged on the electrode terminal pad 137 of the semiconductor element 132 are connected via the conductive member 19 to the bent portions 135-3A, 135-3B at both ends of the electrode terminal 135-1 on the wiring substrate 131.

In other words, the electrode terminal pads 137 of the semiconductor element 132 are connected at two positions to one electrode terminal 135, and the two protruded external connection terminals 134A, 134B are respectively connected and fixed to the corresponding bent portions by means of the thickly-disposed (i.e., a large amount of) conductive member 19.

Also, at this time, non-uniformity of the heights of the protruded external connection terminals 134 or warpage of the wiring substrate 131 is absorbed, and the semiconductor element 132 and the electrode terminals 135 on the wiring substrate are connected with high connection stability (yield) and high connection reliability.

In the Figure, reference numeral 20 denotes an underfill material.

Fifth Embodiment

Figure 14:
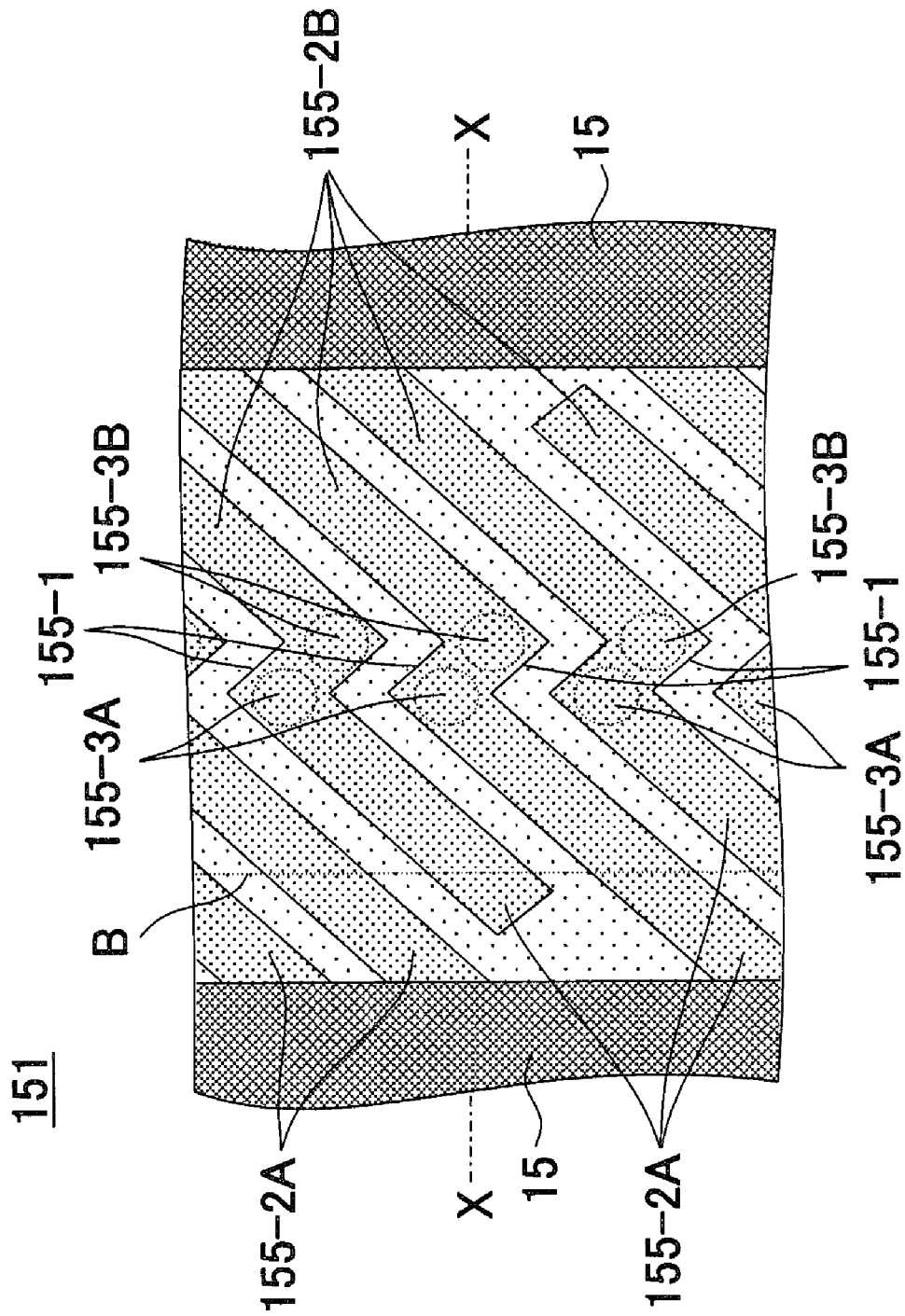
FIG. 14 is a partial plain view of electrode terminals on a wiring substrate according to a fifth embodiment.

FIG. 14 shows the configuration of electrode terminals of a wiring substrate according to a fifth embodiment. In the Figure, dashed line B indicates an outer peripheral edge of a semiconductor element to be mounted on a wiring substrate 151. In other words, the semiconductor element is positioned on the right side of dashed line B. Also, a part where a protruded external connection terminal of the semiconductor element is connected to an electrode terminal on the wiring substrate is indicated by a dashed line circle.

In this fifth embodiment, a plurality of electrode terminals 155 arranged on the wiring substrate 151 each include a first linear portion 155-1 having a fixed width, and second linear portions 155-2A, 155-2B extending from both ends of the relevant first linear portion 155-1.

The first linear portion 155-1 is inclined relative to a direction along the outer peripheral edge of the semiconductor element to be mounted, and a plurality of first linear portions 155-1 are arranged in parallel to each other in a direction along the outer peripheral edge of the semiconductor element.

Meanwhile, two second linear portions 155-2A and 155-2B are connected to each other via bent portions 155-3A, 155-3B, each substantially constituting a right angle, at both ends of the first linear portion 155-1, and they extend in directions that are opposite to each other. Also, each of a plurality of second linear portions 155-2A and a plurality of second linear portions 155-2B is arranged in parallel in a direction along the outer peripheral edge of the semiconductor element.

In this configuration, also, two bent portions, that is, parts to which protruded external connection terminals of the semiconductor element are connected are provided for one electrode terminal 155. At this time, first linear portions 155-1 adjacent to each other along the outer peripheral edge of the semiconductor element has the same length, so the bent portions 155-3A, 155-3B are arranged in parallel to each other along the outer peripheral edge of the semiconductor element, forming rows.

In the Figure, reference numeral 15 denotes a solder resist layer.

Figure 15:
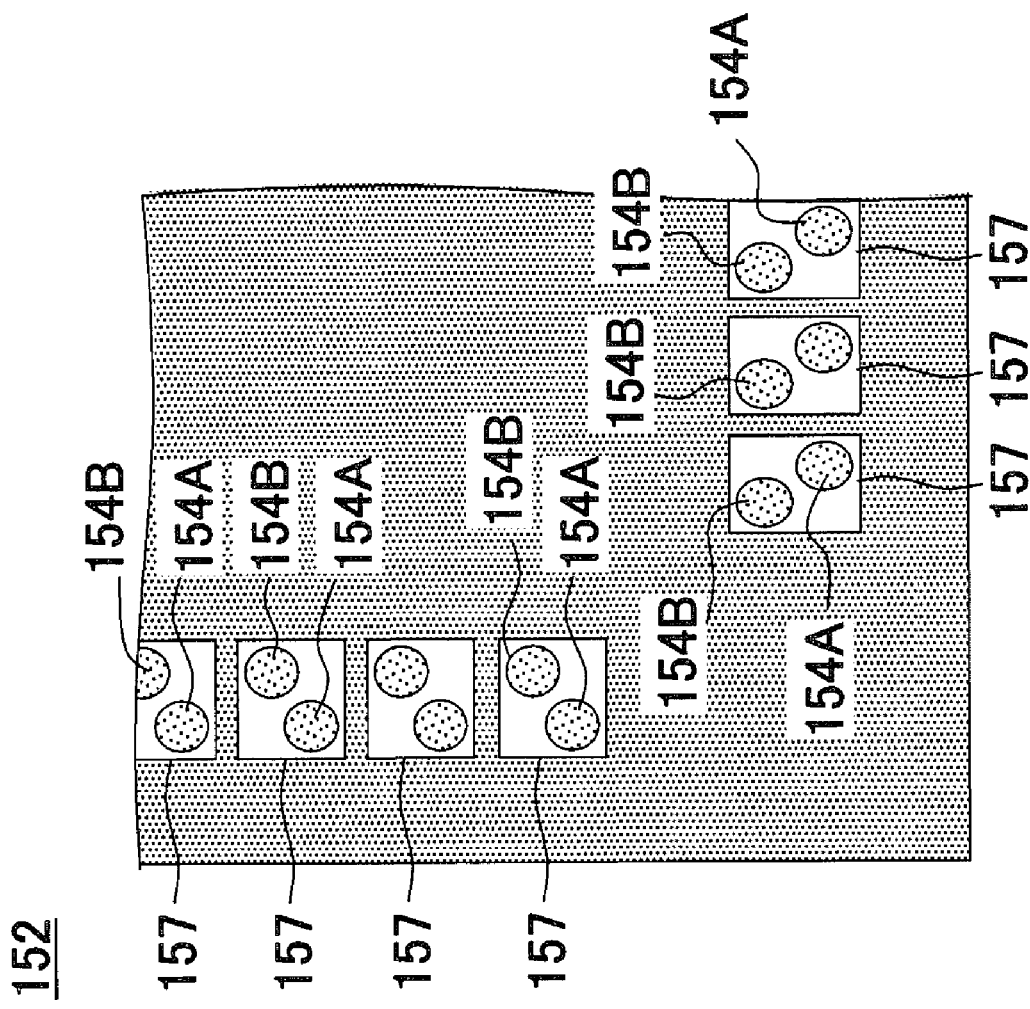
FIG. 15 is a partial plain view of an arrangement structure of external connection terminal pads and protruded external connection terminals of a semiconductor element to be mounted on the wiring substrate shown in FIG. 14.

FIG. 15 shows an arrangement structure of external connection terminal pads and protruded external connection terminals of a semiconductor element 152 to be mounted by means of flip-chip bonding on the wiring substrate 151 having the above-described electrode terminal arrangement structure. FIG. 15 also illustrates one corner portion of a semiconductor element.

In other words, rectangular external connection terminal pads 157 are arranged in a row and in parallel to each other along a linear outer peripheral edge of the semiconductor element 152. In each external connection terminal pad 157, protruded external connection terminals 154A, 154B are aligned substantially along a diagonal line of the rectangle. In other words, the semiconductor element 152 also has two rows of substantially-parallel protruded external connection terminals 154 arranged along one linear peripheral edge thereof.

Figure 16:
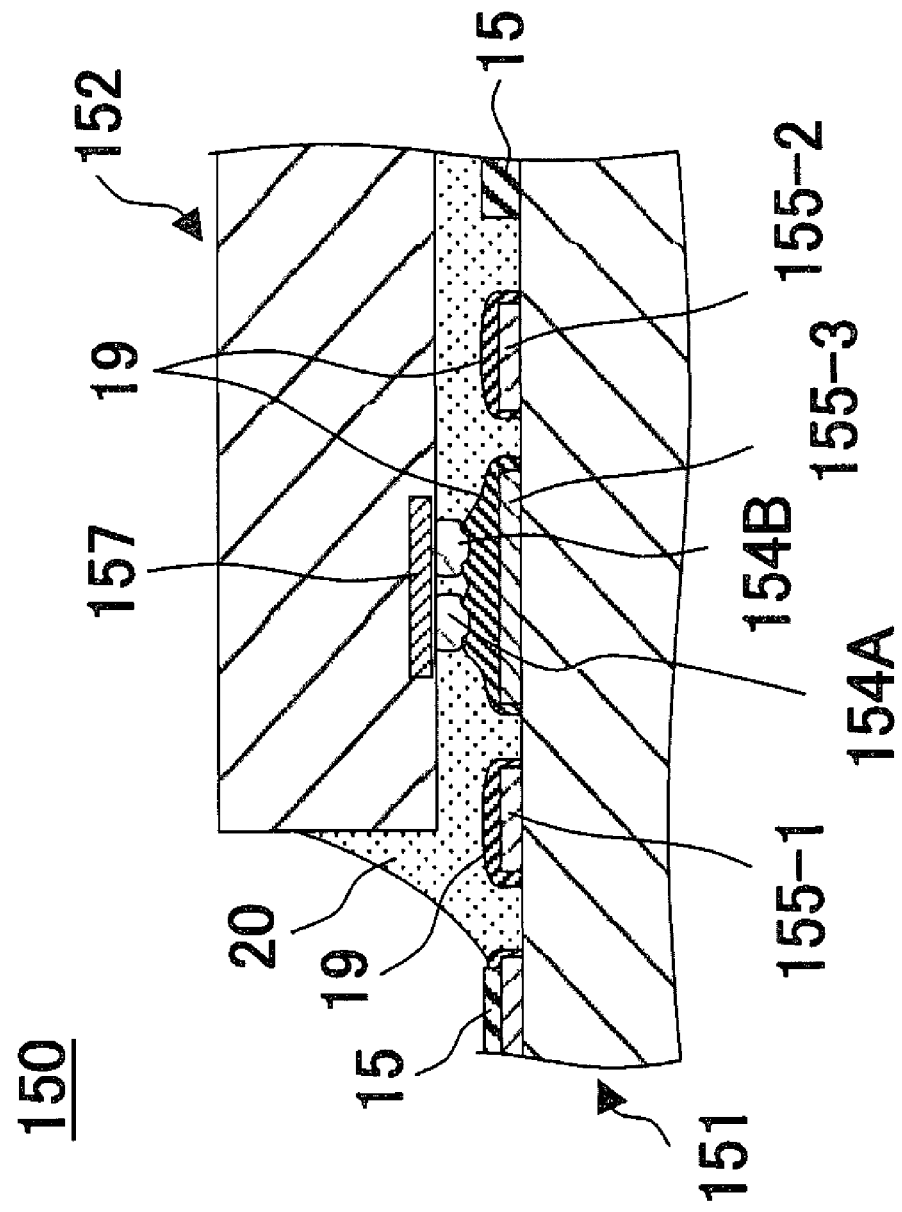
FIG. 16 is a cross-sectional view of a structure in which the semiconductor element shown in FIG. 15 is mounted on the wiring substrate shown in FIG. 14.

FIG. 16 shows a state in which the semiconductor element 152 having the above-described protruded external connection terminal arrangement structure is mounted by means of flip-chip bonding on the wiring substrate 151.

In other words, on one principal surface of the wiring substrate 151, the semiconductor element 152 is mounted by means of a flip-chip (face-down) method, and the protruded external connection terminals 154 of the semiconductor element 152 and the corresponding electrode terminals 155 on the wiring substrate 151 are mechanically and electrically connected via the conductive member 19. Here, the protruded external connection terminals 154A, 154B of the semiconductor element 152 are connected at the bent portions 155-3A, 155-3B of the corresponding electrode terminals 155-1 via the conductive member 19.

In other words, one external connection terminal pad 157 of the semiconductor element 152 is connected at two positions to one electrode terminal 155 on the wiring substrate, and two protruded external connection terminal 154A, 154B are respectively connected and fixed at the corresponding bent portions to the electrode terminal 155 by means of the thickly-disposed (i.e., a large amount of) conductive member 19.

Also, at this time, non-uniformity of the heights of the protruded external connection terminals 154, or warpage of the wiring substrate 151 is absorbed, and the semiconductor element 152 and the electrode terminals 155 on the wiring substrate are connected with high connection stability (yield) and high connection reliability.

In the Figure, reference numeral 20 denotes an underfill material.

What is claimed is:

1. A wiring substrate comprising
a plurality of electrode terminals, to which external connection terminals of an electronic component are coupled, arranged in a row on one principal surface thereof,
wherein the electrode terminals each include:
a first linear portion which has a certain width;
a second linear portion which has a certain width, the second linear portion extending from an end of the first linear portion in a direction different from a direction of the first linear portion; and
a bent portion that is a part where the first linear portion and the second linear portion are connected;
wherein the first linear portion, the second linear portion and the bend portion are formed on the one principle surface.

2. The wiring substrate according to claim 1, wherein the first linear portions of the plurality of electrode terminals are arranged in parallel to each other.

3. The wiring substrate according to claim 1, wherein the second linear portions of the plurality of electrode terminals are arranged in parallel to each other.

4. The wiring substrate according to claim 1, wherein the bent portions of the plurality of electrode terminals are arranged in a row.

5. The wiring substrate according to claim 4, wherein:
- a plurality of the rows formed by the plurality of electrode terminals on the principal surface are formed in parallel to each other; and
- the bent portions of the electrode terminals constituting one of the rows and the bent portions of the electrode terminals constituting another of the rows are shifted from each other in a direction of the rows being formed.

6. The wiring substrate according to claim 1, wherein the plurality of electrode terminals have the bent portions arranged in a plurality of rows, and the plurality of rows are in parallel to each other.

7. The wiring substrate according to claim 1, wherein the plurality of electrode terminals have the bent portions at both ends of the respective first linear portions.

8. The wiring substrate according to claim 7, wherein the bent portions arranged at one of the ends of the first linear portions, and the bent portions arranged at the other of the ends of the first linear portions are aligned in a direction perpendicular to a direction of the electrode terminals being arranged.

9. The wiring substrate according to claim 7, wherein the bent portions arranged at one of the ends of the first linear portions, and the bent portions arranged at the other of the ends of the first linear portions are shifted from each other in a direction of the electrode terminals being arranged.

10. The wiring substrate according to claim 1, wherein each of the second linear portions extends from an end of a corresponding one of the first linear portions at an acute angle relative to the corresponding first linear portion.

11. An electronic device comprising:
- a wiring substrate including a plurality of electrode terminals arranged in a row on one principal surface thereof; and
- an electronic component mounted on the plurality of electrode terminals via a conductive member, wherein:
- the electrode terminals each includes
- a first linear portion which has a certain width,
- a second linear portion which has a certain width, the second linear portion extending from an end of the first linear portion in a direction different from a direction of the first linear portion, and
- a bent portion that is a part where the first linear portion and the second linear portion are connected;
- wherein the first linear portion, the second linear portion and the bend portion are formed on the one principle surface; and
- external connection terminals of the electronic component are coupled to the bent portions of the electrode terminals via the conductive member.

12. The electronic device according to claim 11, wherein the external connection terminals of the electronic component each have a protruded portion.

13. The electronic device according to claim 11, wherein the external connection terminals of the electronic component are coupled to the electrode terminals on the wiring substrate, the external connection terminals of the electronic component forming a plurality of rows that are in parallel to each other.

14. The electronic device according to claim 11, wherein:
- the bent portions of the electrode terminals on the wiring substrate are arranged so that the bent portions conform to the configuration of the external connection terminals of the electronic component; and
- the external connection terminals of the electronic component are coupled to the bent portions of the electrode terminals via the conductive member.

15. The electronic device according to claim 11, wherein the conductive member includes a material containing solder.

* * * * *